(12) United States Patent
Lakdawala et al.

(10) Patent No.: US 9,083,377 B2
(45) Date of Patent: Jul. 14, 2015

(54) ANALOG-TO-DIGITAL CONVERTER

(75) Inventors: Hasnain Lakdawala, Portland, OR (US); Ashoke Ravi, Hillsboro, OR (US); Degani Ofir, Haifa (IL); Alpman Erkan, Hillsboro, OR (US); Julia H. Lu, Hillsboro, OR (US); Gordon Eshel, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 91 days.

(21) Appl. No.: 13/992,112

(22) PCT Filed: May 30, 2012

(86) PCT No.: PCT/US2012/039976
§ 371 (c)(1),
(2), (4) Date: Jun. 6, 2013

(87) PCT Pub. No.: WO2013/180701
PCT Pub. Date: Dec. 5, 2013

(65) Prior Publication Data
US 2014/0225758 A1    Aug. 14, 2014

(51) Int. Cl.
H03M 1/06     (2006.01)
H03M 1/50     (2006.01)

(52) U.S. Cl.
CPC ............. *H03M 1/50* (2013.01); *H03M 1/0607* (2013.01)

(58) Field of Classification Search
CPC ............................ H03M 1/50; H03M 1/0607
USPC .................. 341/111, 166, 118–160
See application file for complete search history.

(56) References Cited

U.S. PATENT DOCUMENTS

| | | | |
|---|---|---|---|
| 6,624,772 B1 * | 9/2003 | Gealow et al. | 341/120 |
| 7,817,076 B2 | 10/2010 | Drummy et al. | |
| 8,773,182 B1 * | 7/2014 | Degani et al. | 327/156 |
| 2005/0118977 A1 * | 6/2005 | Drogi et al. | 455/323 |
| 2006/0097901 A1 * | 5/2006 | Draxelmayr et al. | 341/155 |
| 2008/0030387 A1 | 2/2008 | Sheng et al. | |
| 2010/0103011 A1 | 4/2010 | Nanevicz | |
| 2010/0181973 A1 * | 7/2010 | Pauritsch et al. | 323/280 |
| 2011/0001645 A1 | 1/2011 | Messier et al. | |
| 2011/0304372 A1 * | 12/2011 | Wang et al. | 327/264 |
| 2012/0268299 A1 | 10/2012 | Kidambi | |
| 2012/0319883 A1 * | 12/2012 | Cao et al. | 341/155 |

FOREIGN PATENT DOCUMENTS

KR    WO2011/037292    *  3/2011

OTHER PUBLICATIONS

Amir Zjajo and Jose Pineda de Gyvez,Low-Power High-Resolution Analog to Digital Converters:Design,Test and Calibration, 2011,Springer, p. 9 (chapter 1.3).*

International Searching Authority, "Notification of Transmittal of the International Search Report and the Written Opinion of the International Searching Authority," mailed Oct. 25, 2013, in International application No. PCT/US2013/039976.

* cited by examiner

*Primary Examiner* — Lam T Mai
(74) *Attorney, Agent, or Firm* — Trop, Pruner & Hu, P.C.

(57) ABSTRACT

A technique includes receiving an analog signal and generating at least one second signal that has a timing indicative of a magnitude of the analog signal. The technique includes acquiring a plurality of measurements of the timing, where the measurements vary according to a stochastic distribution; and providing a digital representation of the analog signal based at least in part on the measurements.

20 Claims, 5 Drawing Sheets

ANALOG-TO-DIGITAL CONVERTER

BACKGROUND

An analog-to-digital converter (ADC) may be used for purposes of converting a "real world" analog signal into a signal that is more suitable for digital processing. In this regard, a typical ADC may receive an analog signal from an analog source, such as an analog signal that is derived from an antenna, a microphone, and so forth, and convert the analog signal into a digital form, i.e., a signal of "ones" and "zeros," which may be processed by a digital circuit, such as logic or a microprocessor. There are various forms of ADCs, such as a direct conversion ADC that uses a bank of comparators to generate digital bits indicative of different detected ranges of the analog signal's magnitude and a successive approximation ADC that uses an internal digital-to-analog converter in a feedback loop to iteratively refine an estimate of the digital signal until the estimate has a desired resolution.

DETAILED DESCRIPTION

Figure 1:
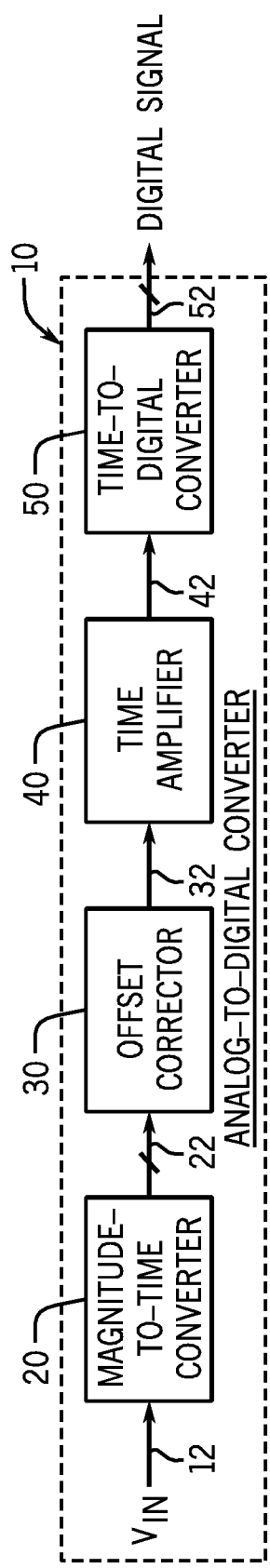
FIGS. 1 and 3 are schematic diagrams of analog-to-digital converters according to example implementations.

Due to such concerns as mismatched circuit parameters (due to fabrication process variations, for example) and relatively long processing times, it may be relatively challenging to convert a relatively small analog voltage (a voltage that has a magnitude less than about 50 millivolts (mV), for example) into a digital representation. Referring to FIG. 1, however, in accordance with systems and techniques that are disclosed herein, an analog-to-digital converter (ADC) 10 may be used for such a purpose. In general, the ADC 10 converts the magnitude of an input analog signal (called "$V_{IN}$" in FIG. 1) into a time-based representation, time amplifies the time-based representation and converts the time-based representation into a digital signal that appears at one or more output terminals 52 of the ADC 10.

More specifically, in accordance with example implementations, the ADC 10 includes a magnitude-to-time converter 20, which receives the $V_{IN}$ signal at its input terminals 12 and converts the $V_{IN}$ signal into one or multiple signals that indicate a timing that corresponds to the magnitude (a voltage, for example) of the $V_{IN}$ signal appear at output terminals 22 of the converter 20. Thus, the magnitude-to-time converter 20 provides a time-based representation of the $V_{IN}$ signal's magnitude.

In accordance with exemplary implementations, the magnitude of the $V_{IN}$ signal is represented by a time difference, which is amplified by a time amplifier 40 of the ADC 10 to produce signals that appear at output terminals 42 of the time amplifier 40 and are received at corresponding input terminals of a time-to-digital converter 50 of the ADC 10. As its name implies, the time-to-digital converter 50 converts the time-based representation into a digital representation of the $V_{IN}$ signal's magnitude, which appears as the digital output signal for the ADC 10 at the ADC's output terminals 52.

As further disclosed herein, the time-to-digital converter 50 performs multiple measurements of the timing of the signals that are provided by the time amplifier 40, and these measurements, in turn, vary stochastically (vary according to a Gaussian distribution, for example). In other words, the measurements indicate different results, which are statistically distributed according to a stochastic distribution. The time-to-digital converter 50 combines (integrates or adds, for example) the measurements together to derive a digital signal that appears at the output terminals 52 of the ADC 10.

More specifically, in accordance with example implementations, the measurement circuits may be identical in design but the measurement circuits vary with respect to each other in their actual fabricated forms primarily due to the fabrication process variations. As further described herein, the ADC takes advantage of the stochastic variations to convert relatively small magnitude analog voltages into corresponding digital representations.

Figure 2:
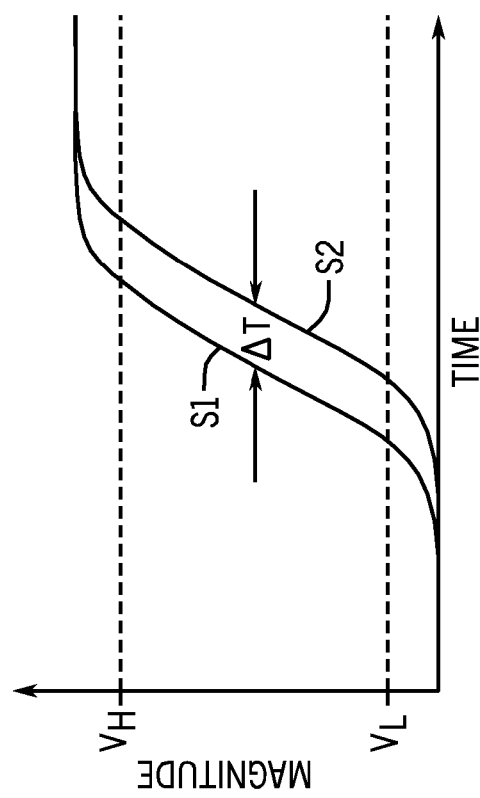
FIG. 2 is an illustration of a timing of signals provided by a magnitude-to-time converter of the analog-to-digital converter of FIG. 1 according to an example implementation.
Figure 3:
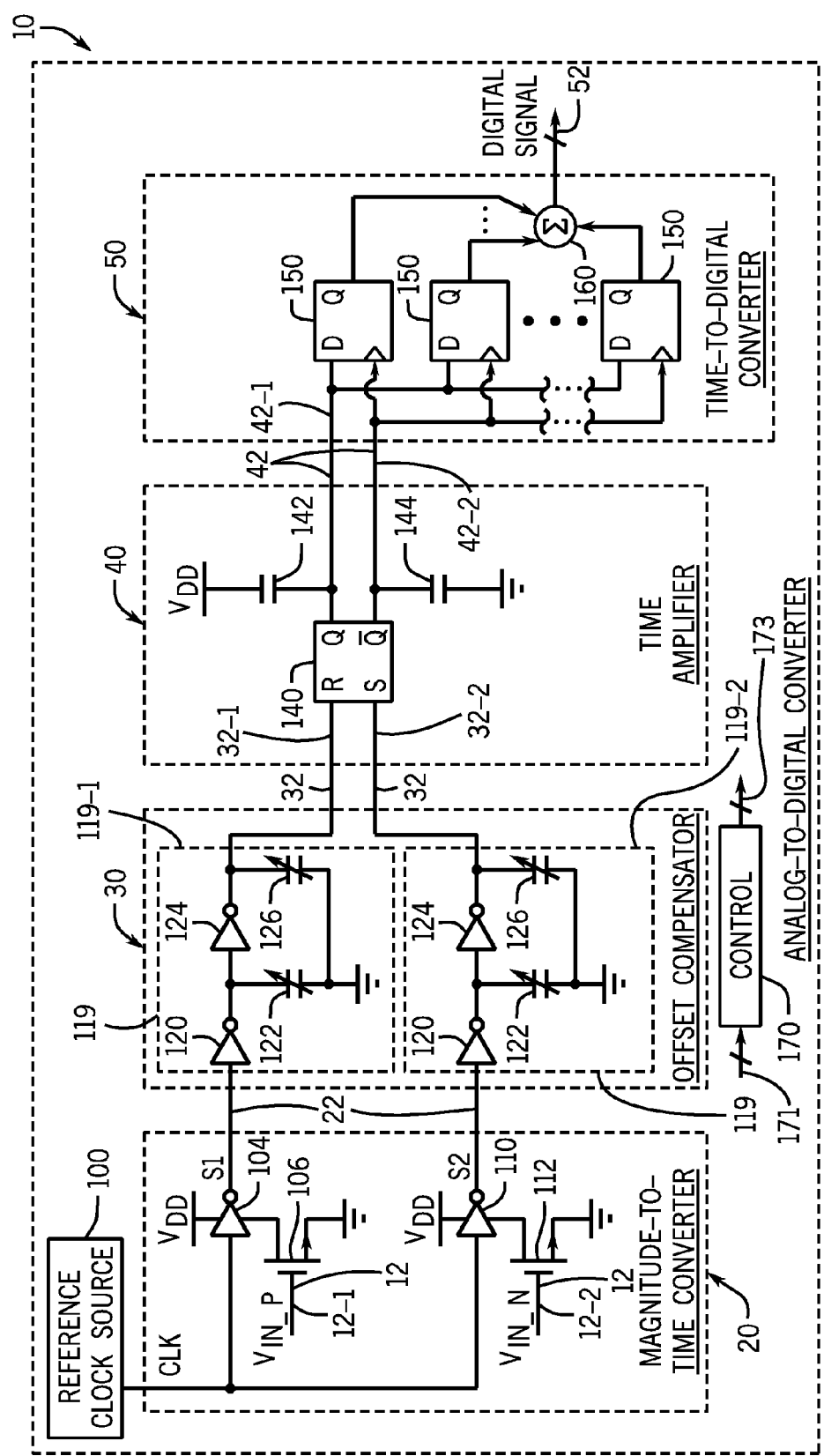

Turning now to the more specific details, referring to FIG. 3, in accordance with some implementations, the magnitude-to-time converter 20 generates two signals (called "S1" and "S2"), and the relative timing of the S1 and S2 signals indicates the magnitude of the $V_{IN}$ analog input signal. Exemplary S1 and S2 signals are generally illustrated in FIG. 2.

More specifically, in accordance with example implementations, the $V_{IN}$ analog input signal is differentially received across corresponding input terminals 12-1 and 12-2 of the magnitude-to-time converter 20. The differential input signal is formed from a larger magnitude single-ended positive signal (called "$V_{IN\_P}$" signal in FIG. 3) that is received by the terminal 12-1; and a relatively smaller magnitude single-ended signal (called "$V_{IN\_N}$" signal in FIG. 3). A delay (called "$\Delta T$" in FIG. 2) between the S1 and S2 signals, in turn, is a function of the magnitude of the $V_{IN}$ analog input signal, in accordance with some implementations. In this regard, in accordance with some implementations, a larger magnitude for the $V_{IN}$ signal corresponds to a longer $\Delta T$ time difference; and conversely, a smaller magnitude for the $V_{IN}$ signal corresponds to a shorter $\Delta T$ time difference.

For the specific example of FIG. 3, the magnitude-to-time converter 20 uses two inverters 104 and 110 and a reference clock signal (called "CLK") for purposes of generating the S1 and S2 signals. As depicted in FIG. 3, the CLK reference clock signal may be provided by a reference clock source 100 of the ADC 10, although the CLK reference clock signal may be provided by a clock source other than a clock source of the ADC 10, in accordance with other implementations.

In general, the CLK reference clock signal propagates through the inverter 104 to produce the S1 signal at the output terminal of the inverter 104; and the CLK reference clock signal propagates through the inverter 110 to form the S2 signal at the output terminal of the inverter 110. The $\Delta T$ time difference between the S1 and S2 signals is attributable to respective current paths of the inverters 104 and 110, whose currents are controlled by the $V_{IN\_P}$ and $V_{IN\_N}$ signals.

More specifically, in accordance with example implementations, the inverters 104 and 110 are complementary metal-oxide-semiconductor (CMOS) inverters. The main current path of each inverter 104, 110 is coupled in series with a metal-oxide-semiconductor field-effect-transistor (MOSFET), which, in turn, is controlled by one of the single-ended analog input signals. In this manner, for the inverter 104, a MOSFET 106 has a drain-to-source path coupled in series with the main current path of the inverter 104; and the gate terminal of the MOSFET 106, in turn, receives the $V_{IN\_P}$ single-ended signal. Thus, the magnitude of the $V_{IN\_P}$ single-ended signal controls the delay of the S1 signal. In a similar fashion, the main current path of the inverter 110 is coupled in series with the drain-to-source path of another MOSFET 112, which, in turn, receives the $V_{IN\_N}$ single-ended signal at its gate terminal. Thus, the magnitude of the $V_{IN\_N}$ single-ended signal controls the delay of the S2 signal.

In general, the more current that is available in the main current path of the inverter 104, 110, the less delay that is introduced by the inverter 104, 110. Due to the differential arrangement, the S2 signal is delayed more than the S1 signal; and in general, a larger magnitude for the $V_{IN}$ analog input signal means a larger $\Delta T$ time difference, and conversely, a smaller magnitude for the $V_{IN}$ analog input signal corresponds to a smaller $\Delta T$ time difference.

The output terminals 22-1 (providing the S1 signal) and the 22-2 (providing the S2 signal) of the magnitude-to-time converter 20 are coupled to corresponding input terminals of an offset compensator 30 of the ADC 10, in accordance with some implementations. In general, the offset compensator 30 may be programmed (as further disclosed below) for purposes of compensating for threshold differences of the components of the magnitude-to-time converter 20. In particular, in accordance with some implementations, due to fabrication process variations, the MOSFETs 106 and 112 may have different corresponding gate threshold voltages. As a result, without compensation provided by the offset compensator 30, errors may be introduced in the digital representation that is provided at the output terminals 52.

In accordance with example implementations, the offset compensator 30 includes paths 119-1 and 119-2, which share a common design 119 for adjusting the delays of the S1 and S2 signals relative to each other. In this manner, as depicted in FIG. 3, the path 119 is formed by two or more serially-coupled inverters 120 and 124. A variable capacitor, in turn, is coupled between the output terminal of each inverter 120, 124 and ground. In this regard, a variable capacitor 122 is coupled between the output terminal of the inverter 120 and ground, and a variable capacitor 126 is coupled between the output terminal of the inverter 124 and ground.

As a non-limiting example, each variable capacitor 122, 126 may be formed from a programmable bank of capacitors such that switches (corresponding to corresponding bits of a configuration value, for example) may be selected to selectively couple the capacitors to the corresponding inverter output terminal to adjust the capacitance. Therefore, by programming the capacitances of the capacitors 122 and 126, the delay that is introduced by the path 119 may be programmed. Different delays for the paths 119-1 and 119-2, in turn, correspond to an overall delay adjustment by the offset compensator 30.

The compensated signals that are provided by the offset compensator 30 (at corresponding output terminals 32) are provided to a time amplifier 40 of the ADC 10, in accordance with example implementations. In general, the time amplifier 40 amplifies the $\Delta T$ time difference to further increase the indicated time difference between the S1 and S2 signals. For this purpose, in accordance with example implementations, the time amplifier 40 includes a circuit, such as a latch, that has an associated regeneration time that is used for the time amplification. In general, the regeneration time refers to the time used by the latch to become stable for a corresponding input change. During the interim time, the latch may be metastable, in that the output signals provided by the latch have meta-stable states that are neither considered high nor low logic values.

Figure 4:
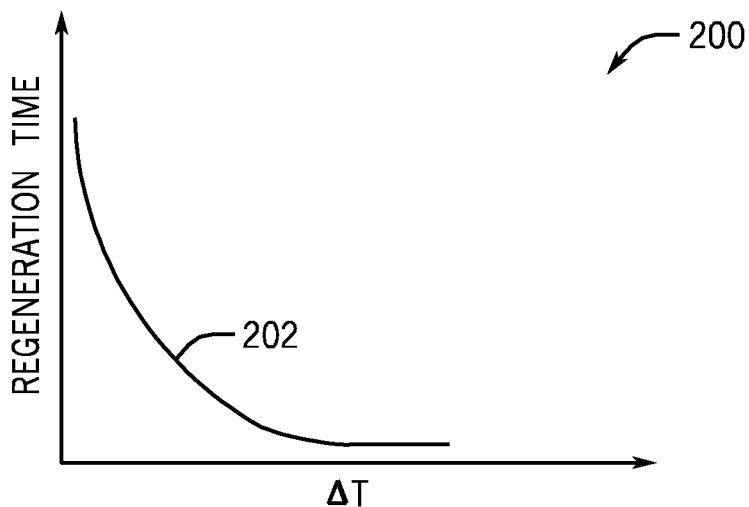
FIG. 4 is an illustration of a regeneration time versus a time difference characteristic of a time amplifier of the analog-to-digital converter of FIG. 1 according to an example implementation.

As depicted in FIG. 3, in accordance with example implementations, the latch that is employed for the time amplifier 40 may be a reset-set (R-S) latch 140, whose reset and set inputs are coupled to the output terminals 32-1 and 32-2, respectively, of the offset compensator 30. Inverting ($\overline{Q}$) and non-inverting (Q) terminals of the R-S latch 140, in turn, are coupled to output terminals 42-2 and 42-1, respectively, of the time amplifier 40. As shown in FIG. 3, programmable capacitors 142 and 144 may be coupled to the output terminals 42-1 and 42-2, respectively, in accordance with some implementations. In general, capacitance values for the capacitors 142 and 144 may be adjusted to adjust the metastability time for the R-S latch 140 and therefore, adjust the time amplification gain for the amplifier 40. These adjustable capacitances, in turn, may be provided by programmable banks of capacitors that are selectively coupled to the Q and $\overline{Q}$ output terminals of the latch 140 in response to programming signals. As a non-limiting example, referring to FIG. 4 in conjunction with FIG. 3, for a relatively small $\Delta T$ time difference, a regeneration time 200 of the R-S latch 140 may, in general, increase (as shown by time portion 202) as the $\Delta T$ time decreases.

Still referring to FIG. 3, the output terminals 42-1 and 42-2 of the time amplifier 40 are coupled to input terminals of the time-to-digital converter 50. In general, in accordance with example implementations, the time-to-digital converter 50 includes multiple measurement circuits that measure the $\Delta T$ time difference. Due primarily to semiconductor process variations, however, the measurements differ stochastically; and more specifically, in accordance with example implementations, the measurements vary according to a Gaussian distribution.

As a more specific example, in accordance with example implementations, each measurement circuit is a D-type flip-flop 150, although other types of measurement circuits may be used, in accordance with other variations. Each D-type flip-flop 150 measures the same signals: the input terminal of each D-type flip-flop 150 is coupled to the output terminal 42-1, and the clock input terminal of each D-type flip-flop 150 is coupled to the output terminal 42-2.

Referring also to FIG. 2 in conjunction with FIG. 3, because the signals that are presented to the D-type flip-flops 150 are relatively close in time with respect to each other, some D-type flip-flops 150 may recognize a logic one value for the S2 signal, whereas other D-type flip-flops 150 may recognize a logic zero value for the S2 signal when the D-type flip-flop 150 is clocked by the S1 signal. It is further assumed that the D-type flip-flop 150 is clocked on the rising, or positive going, edge of the S1 signal.

Due to the process variations, some of the D-type flip-flops 150 therefore provide logic one digital output signals, and the other D-type flip-flops 150 provide logic zero signals. The smaller the $\Delta T$ time difference, the fewer number of D-type flip-flops provide logic one signals; and conversely, the larger the $\Delta T$ time difference, the greater the number of D-type flip-flops 150 that provide logic one values. As depicted in FIG. 3, the time-to-digital converter 50 includes an adder 160 that performs a summation of the logical signals provided by all of the D-type flip-flops 150 to provide the digital signal at the output terminals 52 of the ADC 10.

Figure 5:
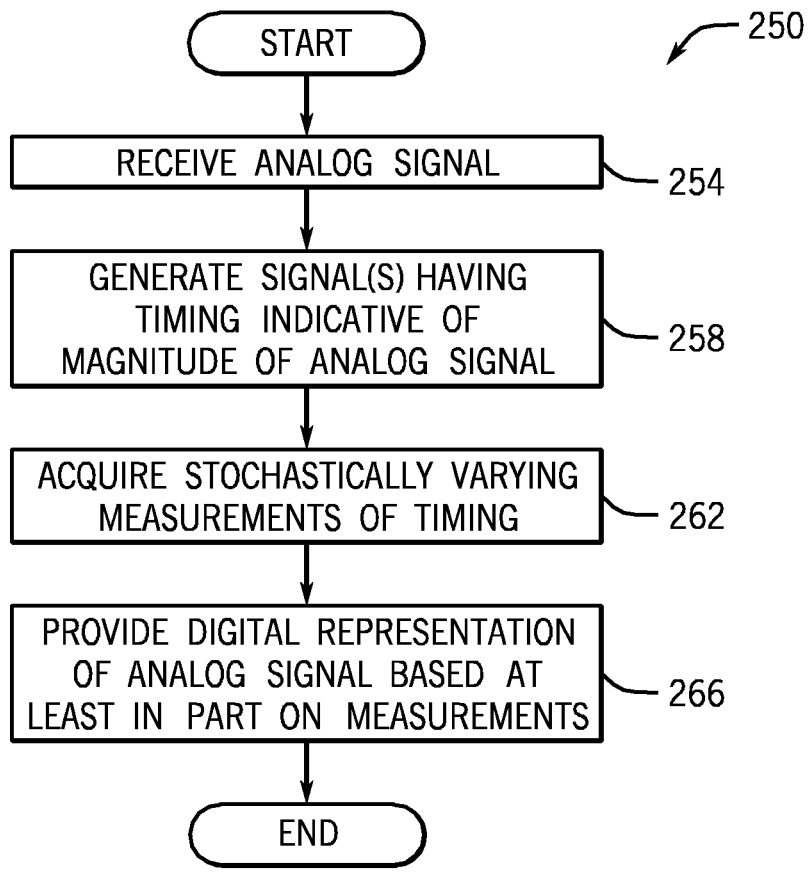
FIG. 5 is a flow diagram depicting a technique to perform analog-to-digital conversion according to an example implementation.

Referring to FIG. 5, thus, to summarize, a technique 250 in accordance with example implementations disclosed herein includes receiving (block 254) an analog signal and generating (block 258) at least a second signal that has a timing that is indicative of a magnitude of the analog signal. Stochastically-varying measurements are acquired, pursuant to block 262 of this timing, and a digital representation of the analog signal is provided, pursuant to block 266, based at least in part on these measurements.

Figure 6:
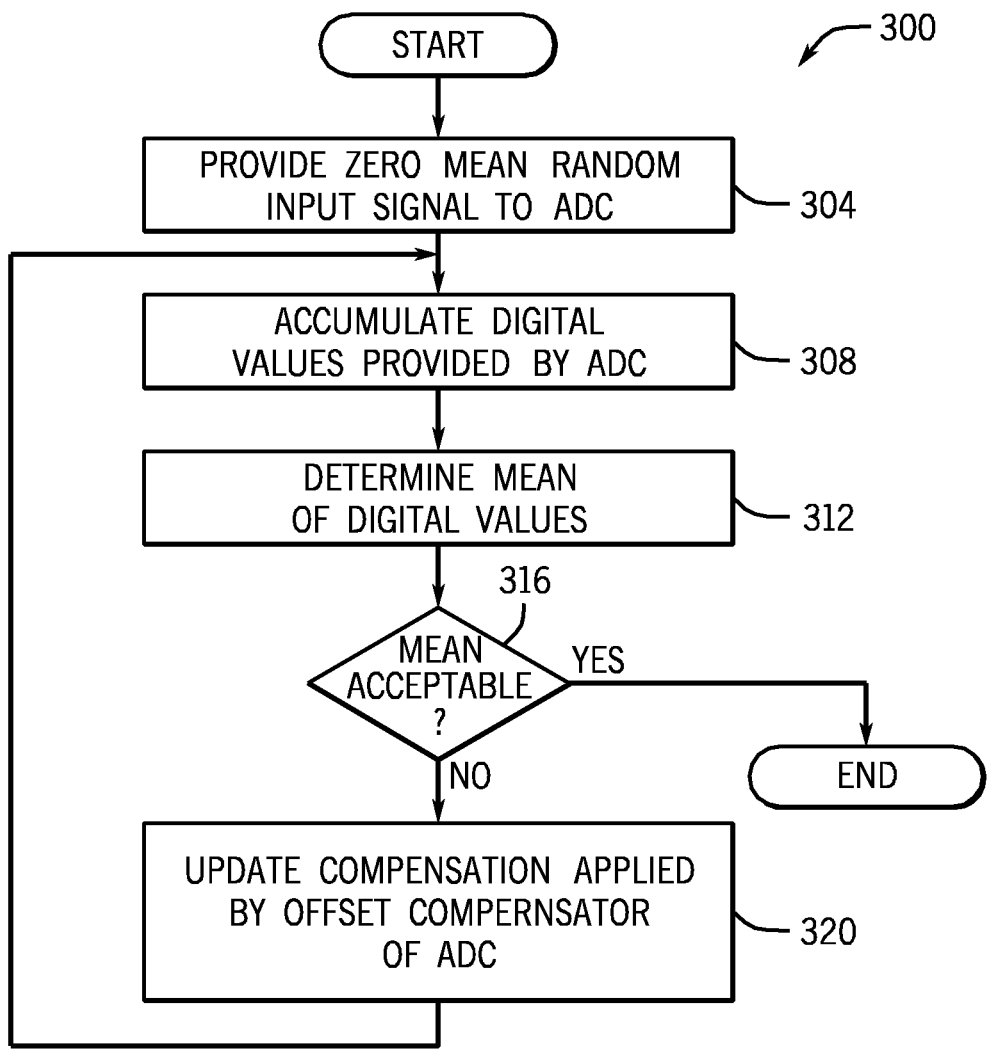
FIGS. 6 and 7 are flow diagrams depicting techniques to calibrate an analog-to-digital converter according to example implementations.

In accordance with example implementations, a technique 300 that is depicted in FIG. 6 may be used for purposes of calibrating the ADC 10 via the offset compensator 30. In this regard, in accordance with some implementations, a control circuit 170 (see FIG. 3) of the ADC 10 may control the ADC 10 (via its input 171 and output 173 terminals) and provide corresponding calibration values for the capacitances of the compensator 30, pursuant to the technique 300.

For this example, a zero mean random input signal is provided as the $V_{IN}$ analog input signal to the ADC 10, pursuant to block 304. It is noted that the random mean signal may be provided, for example, by the least significant bits of a signal that are used in a communication system when the ADC 10 is used as part of a residue amplifier. In this manner, the last few bits may be zero mean noise due to a ten decibel (dB) noise loading specification, and the random nature of this signal.

Using the zero mean random input signal, a relatively long term output mean of the digital values provided by the ADC 10 is observed. More specifically, pursuant to the technique 300, the digital values that are provided by the ADC 10 are accumulated 308 so that a mean of the digital values may be determined, pursuant to block 312. If a determination is made (decision block 316) that the mean is within an acceptable range (below a predetermined acceptable threshold, for example), then the technique 300 ends, as the ADC 10 has been calibrated. Otherwise, if the mean is not acceptable (pursuant to decision block 316), then compensation that is applied by the offset compensator 30 is updated (block 320) and control returns to block 308. As an example, in some implementations, a successive approximation technique may adjust the capacitance(s) applied by one or both paths 119 (see FIG. 3) of the offset compensator 30. Thus, multiple iterations may be performed until the mean is acceptable, thereby indicating calibration of the ADC 10.

Figure 7:
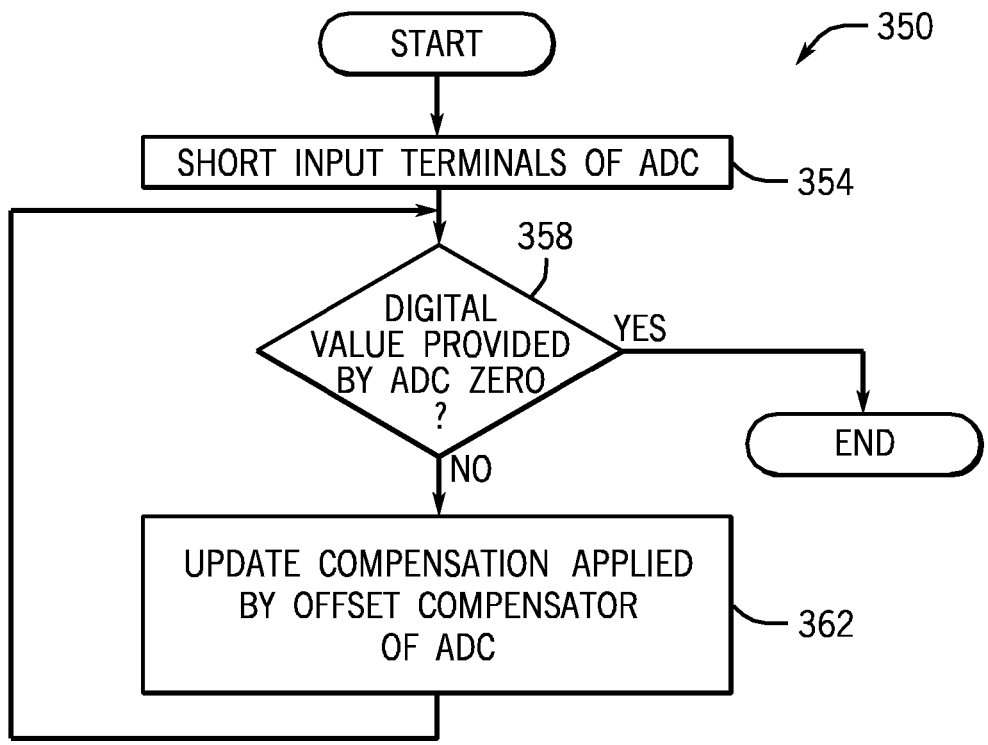

Other variations are contemplated and are within the scope of the appended claims. For example, in accordance with further implementations, a technique 350 (see FIG. 7) may be used for purposes of tuning the offset compensator 30. Pursuant to the technique 350, the control circuit 170 (see FIG. 3) shorts (block 354) the input terminals 12 of the ADC 10. For example, in accordance with some implementations, the control circuit 170 provides a zero voltage magnitude input signal to the ADC 10. In other implementations, the control circuit 170 may activate a switch (a transistor, for example) to short the input terminals 12 of the ADC 10 or lower the voltage across these terminals to zero or new zero. Regardless of the particular implementation, with the input terminals shorted, the ADC 10 performs one or more iterations for purposes of calibrating the ADC 10 using the offset compensator 30. In each iteration, the control circuit 170 determines (decision block 358) whether the digital output of the ADC 10 is zero (as the input voltage is zero), and if so, the calibration technique 350 terminates. Otherwise, pursuant to block 362, the technique 350 includes updating (block 362) (via a successive approximation technique, for example) one or more capacitance values of the offset compensator 30 for purposes of ultimately zeroing the output of the ADC 10.

Figure 8:
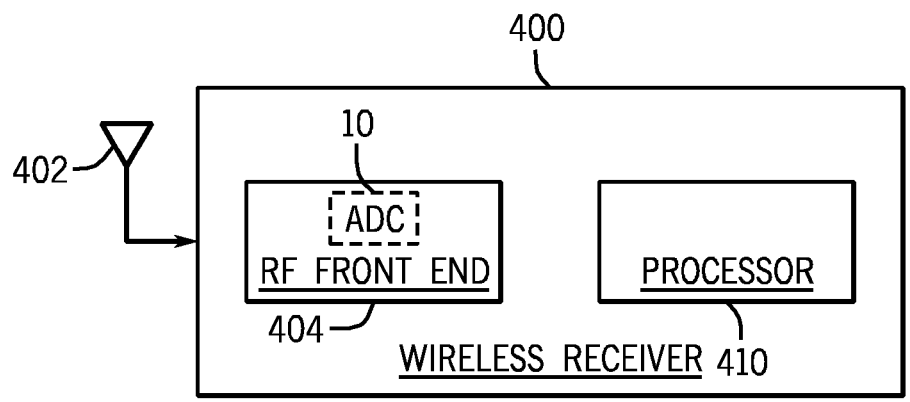
FIG. 8 is a schematic diagram of a wireless receiver according to an example implementation.

The ADC 10 may be used in a number of different circuits and applications, depending on the particular implementation. As a non-limiting example, FIG. 8 depicts the use of the ADC 10 in a wireless receiver 400. For this implementation, the receiver 400 may receive, for example, a wireless signal via an antenna 402. The receiver 400 may include a radio frequency (RF) front end 404, which processes the received RF signal and which may include the ADC 10 for purposes of converting a relatively small magnitude analog signal into a digital representation. In this regard, once converted into the digital form, a processor 410 of the receiver 400 may further process the received wireless content, in accordance with example implementations.

The following examples pertain to further embodiments.

In an example implementation, an apparatus includes a first converter and a second converter. The first converter provides at least one signal that has a timing, which is indicative of a magnitude of an analog signal. The second converter provides a digital representation of the analog signal in response to the timing. The second converter includes time comparators and a combiner. Each time comparators is adapted to measure the timing, and the measurements varying among the time converters according to a stochastic distribution. The combiner combines the measurements to provide the digital representation.

In some implementations, the analog signal includes a differential signal that is formed from a difference of a first single ended signal and a second single ended signal. The first converter includes a first delay element and a second delay element. The first delay element delays a reference signal in response to the first single ended signal to provide a first delayed signal, and the second delay element delays the reference signal in response to the second single ended signal to provide a second delayed signal. The timing includes a timing of the first delayed signal relative to the second delayed signal.

In some implementations, the first delay element may include an inverter and a transistor that is adapted to regulate a current in the inverter in response to the first single ended signal.

In some implementations, the apparatus may include a time amplifier that is adapted to amplify a timing difference indicated by the signal(s) that is provided by the first converter.

In some implementations, the time amplifier may include a latch that is adapted to use a regeneration time characteristic of the latch to amplify the timing difference.

In some implementations, the apparatus includes an offset compensator that is adapted to compensate for a timing error of the first converter due to a fabrication process variation of components of the first converter.

In some implementations, each time comparator is adapted to digitally indicate the measurement of the timing, and the combiner includes an adder to add together the digital indications provided by the time comparators to provide the digital representation.

In some implementations, the apparatus further includes an analog interface to provide the analog signal and a processor to process the digital representation. The first converter is adapted to delay a reference clock signal based at least in part on the magnitude of the analog signal to provide the signal(s).

In some implementations, the analog interface may include a radio frequency (RF) front end.

In some implementations, the stochastic distribution is primarily attributable to semiconductor process variations.

In some implementations, the time comparators may include a plurality of latches to provide signals indicative of the measurements, and the combiner may include an adder to combine the measurements to provide the digital representation.

In some implementations, a technique includes receiving an analog signal; generating at least one second signal having a timing indicative of a magnitude of the analog signal; acquiring measurements of the timing, where the measurements vary according to a stochastic distribution; and providing a digital representation of the analog signal based at least in part on the measurements.

In some implementations, the technique includes providing the digital representation includes adding the measurements together.

In some implementations, a converter is calibrated that generates the second signal. This calibration includes providing a zero mean random input signal as the analog signal; accumulating digital representations corresponding to the zero mean random input signal; determining a mean of the digital representations; and using a successive approximation to adjust the converter based at least in part on the mean.

In some implementations, the technique includes calibrating a converter that is used to generate the second signal(s). The calibration includes shorting the analog signal; and using successive approximation to selectively adjust the converter based at least in part on the digital representation that is provided due to the shorted analog signal.

In some implementations, the receiving, generating, acquiring and providing includes performing analog-to-digital conversion of the analog signal.

In some implementations, an apparatus may include an analog-to-digital converter that is configured to perform any one of the techniques that are set forth above.

While a limited number of examples have been disclosed herein, those skilled in the art, having the benefit of this disclosure, will appreciate numerous modifications and variations therefrom. It is intended that the appended claims cover all such modifications and variations.

What is claimed is:

1. An apparatus comprising:
   a first converter to provide at least one signal, the at least one signal having a timing indicative of a magnitude of an analog signal; and
   a second converter to provide a digital representation of the analog signal in response to the timing, the second converter comprising:
      a plurality of time comparators, each of the time comparators being adapted to measure the timing, and the measurements varying among the time comparators according to a stochastic distribution; and
      a combiner to combine the measurements to provide the digital representation.

2. The apparatus of claim 1, wherein:
   the analog signal comprises a differential signal formed from a difference of a first single ended signal and a second single ended signal;
   the first converter comprises:
      a first delay element to delay a reference signal in response to the first single ended signal to provide a first delayed signal;
      a second delay element to delay the reference signal in response to the second single ended signal to provide a second delayed signal; and
   the timing comprises a timing of the first delayed signal relative to the second delayed signal.

3. The apparatus of claim 2, wherein the first delay element comprises:
   an inverter; and
   a transistor adapted to regulate a current in the inverter in response to the first single ended signal.

4. The apparatus of claim 1, further comprising:
   a time amplifier adapted to amplify a timing difference indicated by the at least one signal provided by the first converter.

5. The apparatus of claim 4, wherein the time amplifier comprises a latch adapted to use a regeneration time characteristic of the latch to amplify the timing difference.

6. The apparatus of claim 1, further comprising:
   an offset compensator adapted to compensate for a timing error of the first converter due to a fabrication process variation of components of the first converter.

7. The apparatus of claim 1, wherein
   each time comparator is adapted to digitally indicate the measurement of the timing, and
   the combiner comprises an adder to add together the digital indications provided by the time comparators to provide the digital representation.

8. The apparatus of claim 1, further comprising:
   an analog interface to provide the analog signal; and
   a processor to process the digital representation,
   wherein the first converter is adapted to delay a reference clock signal based at least in part on the magnitude of the analog signal to provide the at least one signal.

9. The apparatus of claim 8, wherein the analog interface comprises a radio frequency (RF) front end.

10. The apparatus of claim 1, wherein the stochastic distribution is primarily attributable to semiconductor process variations.

11. The apparatus of claim 1, wherein the time comparators comprise a plurality of latches to provide signals indicative of the measurements, and the combiner comprises an adder to combine the measurements to provide the digital representation.

12. A method comprising:
   receiving an analog signal;
   generating at least one second signal having a timing indicative of a magnitude of the analog signal;
   acquiring a plurality of measurements of the timing, the measurements varying according to a stochastic distribution; and
   providing a digital representation of the analog signal based at least in part on the measurements.

13. The method of claim 12, wherein providing the digital representation comprises adding the measurements together.

14. The method of claim 12, further comprising:
   calibrating a converter that generates the second signal, the calibrating comprising:
      providing a zero mean random input signal as the analog signal;
      accumulating digital representations corresponding to the zero mean random input signal;
      determining a mean of the digital representations; and
      using successive approximation to adjust the converter based at least in part on the mean.

15. The method of claim 12, further comprising:
   calibrating a converter used to generate the at least one second signal, the calibrating comprising:
      shorting the analog signal; and
      using successive approximation to selectively adjust the converter based at least in part on the digital representation provided due to the shorted analog signal.

16. The method of claim 12, wherein the at least one second signal comprises a plurality of signals, and the timing comprises a time difference between the plurality of signals.

17. The method of claim 16, further comprising amplifying the time difference to provide an amplified signal, wherein acquiring the measurements comprises acquiring the measurements using the amplified signal.

18. The method of claim 17, wherein the amplifying comprises using a regeneration time characteristic of a latch.

19. The method of claim 12, wherein the receiving, generating, acquiring and providing comprise performing analog-to-digital conversion of the analog signal.

20. An apparatus comprising an analog-to-digital converter configured to perform the method of claim 12.

* * * * *